United States Patent
Cho et al.

(10) Patent No.: US 9,971,181 B2
(45) Date of Patent: May 15, 2018

(54) IN-CELL TOUCH LIQUID CRYSTAL DISPLAY DEVICE AND METHOD FOR MANUFACTURING THE SAME

(71) Applicant: LG Display Co., Ltd., Seoul (KR)

(72) Inventors: YangHo Cho, Gyeongsangbuk-do (KR); YoungSik Kim, Gyeongsangbuk-do (KR); YoonHwan Woo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days. days.

(21) Appl. No.: 14/980,076

(22) Filed: Dec. 28, 2015

(65) Prior Publication Data

US 2016/0187695 A1   Jun. 30, 2016

(30) Foreign Application Priority Data

Dec. 31, 2014   (KR) .......................... 10-2014-0195980

(51) Int. Cl.

| | | |
|---|---|---|
| *G02F 1/1333* | (2006.01) | |
| *G02F 1/1362* | (2006.01) | |
| *G02F 1/1368* | (2006.01) | |
| *H01L 27/12* | (2006.01) | |

(Continued)

(52) U.S. Cl.
CPC .... *G02F 1/13338* (2013.01); *G02F 1/136227* (2013.01); *H01L 27/124* (2013.01); *H01L 27/1222* (2013.01); *H01L 27/1262* (2013.01); *H01L 29/78633* (2013.01); *H01L 29/78675* (2013.01); *G02F 2001/134372* (2013.01)

(58) Field of Classification Search
None
See application file for complete search history.

(56) References Cited

U.S. PATENT DOCUMENTS

2004/0262611 A1* 12/2004 Lai ...................... G02F 1/13458
257/72
2006/0097991 A1* 5/2006 Hotelling .............. G06F 3/0416
345/173

(Continued)

FOREIGN PATENT DOCUMENTS

| KR | 10-2007-0058971 A1 | 6/2007 |
|---|---|---|
| KR | 10-2011-0124472 A1 | 11/2011 |
| KR | 10-2013-0110906 A1 | 10/2013 |

*Primary Examiner* — Ryan Crockett
(74) *Attorney, Agent, or Firm* — Morgan, Lewis & Bockius LLP

(57) ABSTRACT

An in-cell touch liquid crystal display device and a method for manufacturing the same are disclosed in which color mixing among pixels can be prevented. The in-cell touch liquid crystal display device includes a thin film transistor (TFT) arranged in a plurality of pixel areas; a source contact layer connected to a source electrode of the TFT and a drain contact layer connected to a drain electrode of the TFT; first and second passivation layers on the source contact layer and the drain contact layer; a common electrode on the second passivation layer; a third passivation layer on the common electrode; a conductive line to overlap the common electrode by passing through the third passivation layer; a fourth passivation layer on the third passivation layer and the conductive line; and a pixel electrode on the fourth passivation layer connected to the drain contact layer in a first contact hole.

16 Claims, 12 Drawing Sheets

(51) Int. Cl.
  *H01L 29/786*  (2006.01)
  *G02F 1/1343*  (2006.01)

(56) References Cited

U.S. PATENT DOCUMENTS

| | | | |
|---|---|---|---|
| 2012/0068944 A1* | 3/2012 | Oh | G02F 1/13338 |
| | | | 345/173 |
| 2012/0162089 A1* | 6/2012 | Chang | G06F 3/0412 |
| | | | 345/173 |
| 2013/0010246 A1* | 1/2013 | Miwa | G02F 1/136227 |
| | | | 349/138 |
| 2013/0077034 A1* | 3/2013 | Jung | G02F 1/1345 |
| | | | 349/122 |
| 2013/0257774 A1 | 10/2013 | Kim et al. | |
| 2015/0070646 A1* | 3/2015 | Kim | C09K 19/3098 |
| | | | 349/178 |
| 2015/0219948 A1* | 8/2015 | Kamimura | G02F 1/13338 |
| | | | 349/12 |
| 2016/0026044 A1* | 1/2016 | Nam | G02F 1/1368 |
| | | | 349/42 |
| 2016/0103547 A1* | 4/2016 | Lu | G06F 3/0416 |
| | | | 345/174 |
| 2016/0195785 A1 | 7/2016 | Kimura et al. | |
| 2017/0153747 A1* | 6/2017 | Yoon | G06F 3/0412 |

\* cited by examiner (a)

< Vcom top structure : 11mask >

| mask | layer |
|---|---|
| 1 | light shield layer |
| 2 | active layer |
| 3 | gate layer |
| 4 | S/D contact hole |
| 5 | source / drain layer |
| 6 | PAS0 |
| 7 | PAS1 |
| 8 | pixel electrode |
| 9 | conductive line |
| 10 | PAS2 |
| 11 | common electrode |

FIG. 6

< PXL top structure : 11mask >

| mask | layer |
|---|---|
| 1 | light shield layer |
| 2 | active layer |
| 3 | gate layer |
| 4 | S/D contact hole |
| 5 | source / drain layer |
| 6 | PAS1 |
| 7 | common electrode |
| 8 | PAS2 |
| 9 | conductive line |
| 10 | PAS0 / PAS3 |
| 11 | pixel electrode |

IN-CELL TOUCH LIQUID CRYSTAL DISPLAY DEVICE AND METHOD FOR MANUFACTURING THE SAME

CROSS REFERENCE TO RELATED APPLICATIONS

This application claims the benefit of the Korean Patent Application No. 10-2014-0195980 filed on Dec. 31, 2014, which is hereby incorporated by reference for all purposes as if fully set forth herein.

BACKGROUND OF THE INVENTION

Field of the Invention

The present invention relates to a liquid crystal display device, and more particularly, to an in-cell touch liquid crystal display device having a pixel electrode top structure and a method for manufacturing the same.

Discussion of the Related Art

A touch screen has been used, which may allow a user to directly input information on a screen by using a finger or pen instead of a mouse or keyboard conventionally used as an input device of a flat panel display device or a key pad used as an input device of portable electronic equipment. The touch screen has an advantage in that anyone may easily manipulate it, and thus its application has been increased.

Such a touch screen has been applied to monitors such as a navigation system, an industrial terminal, a notebook computer, a banking automated teller machine (ATM), and a game machine, portable terminals such as a cellular phone, MP3, PDA, PMP, PSP, a portable game machine, a DMB receiver, and a tablet PC, and home appliances such as a refrigerator, a microwave oven, and a washing machine.

The touch screen may be categorized into an in-cell touch type where a touch screen is built in a cell of a liquid crystal panel, an on cell touch type where a touch screen is formed on a cell of a liquid crystal panel, and an add on type where a touch screen is combined with an outside of a display panel, in accordance with a structure combined with a liquid crystal panel. Hereinafter, a touch screen (touch panel) combined with a liquid crystal panel will be referred to as a 'touch display device.'

FIGS. 1A, 1B and 1C illustrate a touch display device according to the related art to which a touch screen is applied. FIG. 1A illustrates a touch display device of an add on type, FIG. 1B illustrates a touch display device of a modified add on type, and FIG. 1C illustrates a touch display device of a hybrid type.

In the touch display device of the add on type in FIG. 1A and the modified add on type in FIG. 1B, a touch screen is arranged on a liquid crystal panel that includes a thin film transistor (TFT) array substrate 1 and a color filter array substrate 2. A touch driving electrode TX and a touch receiving electrode RX are arranged on the touch screen. At this time, the touch driving electrode TX and the touch receiving electrode RX may be arranged on their respective layers different from each other, or may be arranged on the same layer as each other.

In the touch display device of the hybrid type in FIG. 1C, a touch driving electrode TX is arranged on a TFT array substrate 1, and a touch receiving electrode RX is arranged on a color filter array substrate 2.

Since the liquid crystal panel and the touch screen of the touch display device according to the related art should be manufactured separately, a problem occurs in that a manufacturing process is complicated and its cost is increased.

Recently, in order to reduce a thickness of the touch display device and save its manufacturing cost, an in-cell touch liquid crystal display device has been developed, in which a touch electrode (touch sensor) is built in a cell of a liquid crystal panel. In the in-cell touch liquid crystal display device, a common electrode arranged on a TFT array substrate of the liquid crystal panel is used as a touch sensor.

FIG. 2 illustrates an in-cell touch liquid crystal display device of a mutual capacitive type.

Referring to FIG. 2, the in-cell touch liquid crystal display device of a mutual capacitive type drives a common electrode arranged on a TFT array substrate of a liquid crystal panel 10 as a touch driving electrode TX and a touch receiving electrode RX. This mutual capacitive type has a problem in that a bezel width is increased as a touch driving line 14 and a touch receiving line 12 are arranged on left and right bezel areas of the liquid crystal panel 10.

FIG. 3 illustrates a manufacturing process of an in-cell touch display device of a common electrode Vcom top type, and also illustrates the number of masks required for the manufacturing process.

Referring to FIG. 3, a common electrode Vcom top pixel structure is applied to the in-cell touch liquid crystal display device according to the related art V. In the common electrode Vcom top pixel structure, a common electrode is arranged on an uppermost layer, and a pixel electrode is arranged below the common electrode.

In the in-cell touch liquid crystal display device according to the related art in which a low temperature poly silicon (LTPS) is used as a material of an active layer of a TFT and to which the common electrode Vcom top pixel structure is applied, 11 masks are required for a process for manufacturing the in-cell touch liquid crystal display device.

As described above, if the common electrode Vcom top pixel structure is applied to the in-cell touch liquid crystal display device according to the related art, light transmittance is high at an edge portion of pixels, whereby a problem occurs in that mixed colors are generated among red, green and blue pixels.

SUMMARY OF THE INVENTION

Accordingly, the present invention is directed to an in-cell touch liquid crystal display (LCD) device and a method for manufacturing the same that substantially obviate one or more problems due to limitations and disadvantages of the related art.

An object of the present invention is to provide an in-cell touch liquid crystal display device of a pixel electrode top structure and a method for manufacturing the same.

Another object of the present invention is to provide an in-cell touch liquid crystal display device and a method for manufacturing the same, in which mixed colors among pixels can be prevented from being generated.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described herein, an in-cell touch liquid crystal display device comprises a thin film transistor (TFT) arranged in a plurality of pixel areas; a source contact layer connected to a source electrode of the TFT and a drain contact layer connected to a drain electrode of the TFT; first and second passivation layers arranged on the source contact layer and the drain contact layer; a common electrode arranged on the second passivation layer; a third passivation layer arranged on the common electrode; a conductive line arranged to overlap the common electrode by passing through the third passivation layer; a fourth passivation layer arranged on the third passivation layer and the conductive line; and a pixel electrode connected to the drain contact layer in a first contact hole and arranged on the fourth passivation layer.

In another aspect, a method for manufacturing an in-cell touch liquid crystal display device comprises forming a thin film transistor (TFT) in a plurality of pixel areas; forming a source contact layer connected to a source electrode of the TFT and a drain contact layer connected to a drain electrode of the TFT; forming first and second passivation layers on the source contact layer and the drain contact layer; forming a common electrode on the second passivation layer; forming a third passivation layer on the common electrode; forming a second contact hole partially exposing the common electrode; forming a conductive line to be connected with the common electrode; forming a fourth passivation layer on the third passivation layer and the conductive line; forming a first contact hole exposing the drain contact layer; and forming a pixel electrode in the first contact hole and on the fourth passivation layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 3 illustrates a manufacturing process of an in-cell touch display device of a common electrode Vcom top type, and also illustrates the number of masks required for the manufacturing process;

FIG. 6 illustrates a method for manufacturing an in-cell touch liquid crystal display device according to the example embodiment, and also illustrates the number of masks required for the manufacturing process;

DETAILED DESCRIPTION OF THE ILLUSTRATED EMBODIMENTS

Figure 1A:
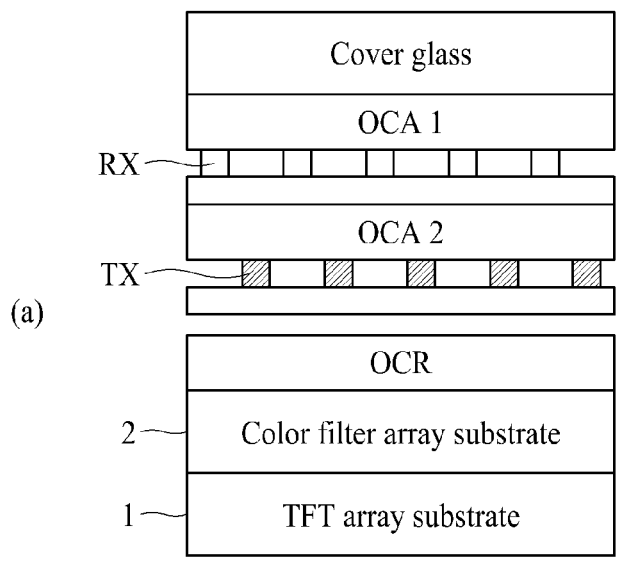
FIG. 1A, FIG. 1B, and FIG. 1C illustrate a touch display device according to the related art to which a touch screen is applied.
Figure 1B:
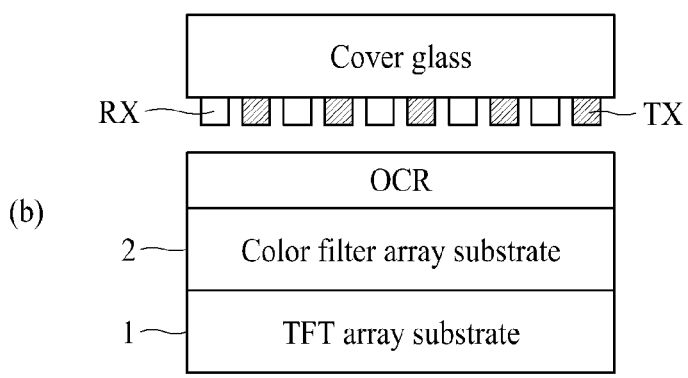
Figure 1C:
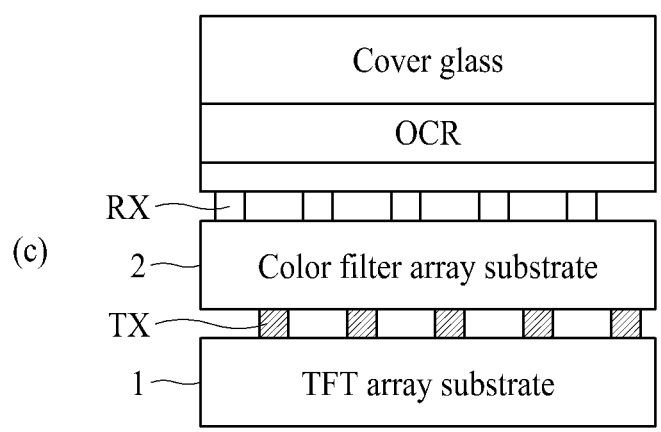
Figure 2:
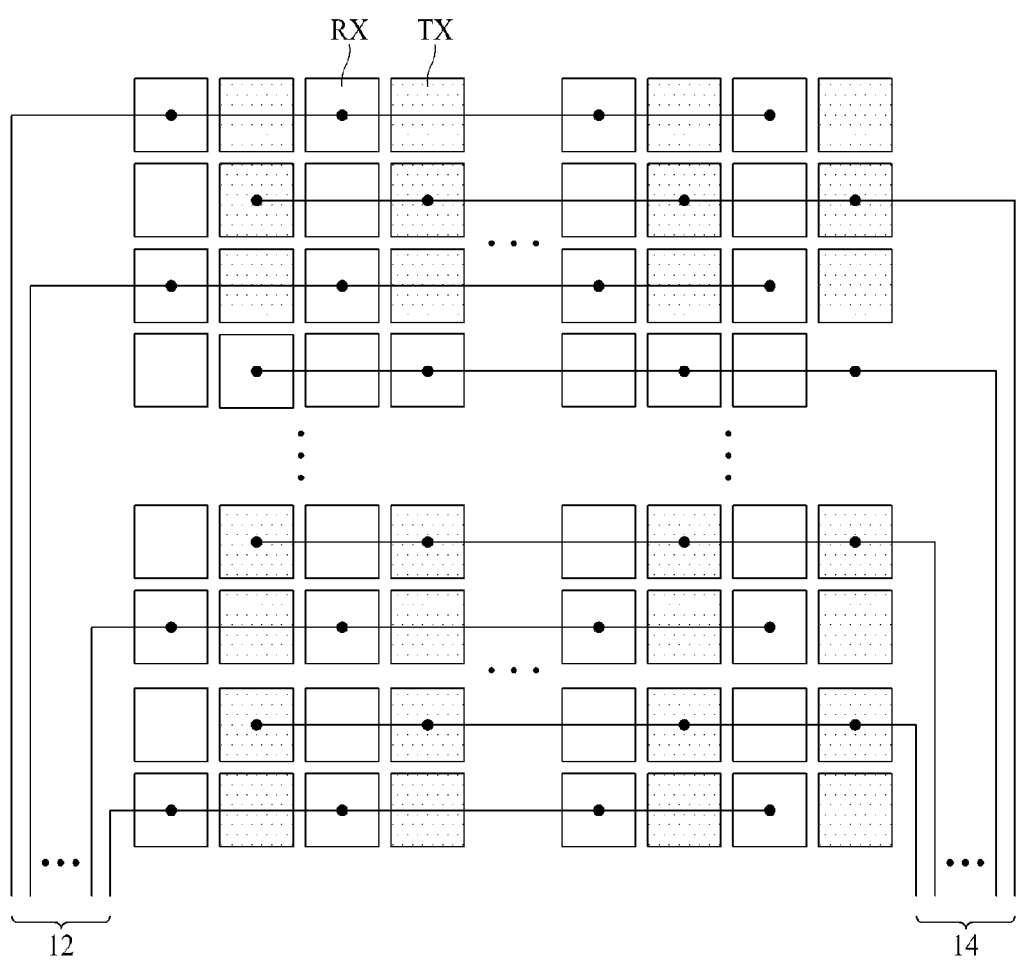
FIG. 2 illustrates an in-cell touch liquid crystal display device of a mutual capacitive type.

The same reference numbers substantially mean the same elements through the specification.

In the following description of the present invention, if detailed description of elements or functions known in respect of the present invention is not relevant to the subject matter of the present invention, the detailed description will be omitted.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

In this specification, in adding reference numbers to elements of respective drawings, it is to be noted that the same reference elements have the same reference numbers if possible even though the same reference elements are shown on different drawings.

A shape, a size, a ratio, an angle, and a number disclosed in the drawings for describing embodiments of the present invention are merely an example, and thus, the present invention is not limited to the illustrated details. Like reference numerals refer to like elements throughout the specification. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It should be understood that the term "at least one" includes all combinations related with one or more items. For example, "at least one among a first item, a second item and a third item" may include all combinations of two or more items selected from the first, second and third items as well as each item of the first, second and third items.

It will be understood that, although the terms "first", "second", etc. may be used herein to describe various elements, these elements should not be limited by these terms. These terms are only used to distinguish one element from another element. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Various examples of a liquid crystal display device such as a twisted nematic (TN) mode, a vertical alignment (VA) mode, an in plane switching (IPS) mode and a fringe field switching (FFS) mode have been developed in accordance with a mode for controlling arrangement of a liquid crystal layer.

In the IPS mode and the FFS mode among the modes of the liquid crystal display device, a pixel electrode and a common electrode are arranged on a lower substrate, to control whereby arrangement of the liquid crystal layer is controlled by an electric field between the pixel electrode and the common electrode.

Particularly, in the IPS mode, a pixel electrode and a common electrode are alternately arranged in parallel to generate a horizontal electric field between both electrodes, whereby arrangement of the liquid crystal layer is controlled. In the IPS mode, arrangement of the liquid crystal layer is not controlled at a portion above the pixel electrode and the common electrode, whereby a problem occurs in that transmittance of light is deteriorated at the portion.

The FFS mode has been devised to solve the problem of the IPS mode. In the FFS mode, the pixel electrode and the common electrode are formed to be spaced apart from each other by interposing an insulating layer therebetween.

In the FFS mode, one electrode is formed in a shape of a plate or pattern, and the other electrode is formed in a shape of a finger, whereby arrangement of the liquid crystal layer is controlled through a fringe field generated between both electrodes.

An in-cell touch liquid crystal display device and a method for manufacturing the same according to the example embodiment of the present invention are intended to manufacture a thin film transistor (TFT) array substrate (lower substrate) of the FFS mode, wherein a touch sensor for detecting a touch of a user is built in the TFT array substrate (lower substrate).

Hereinafter, the in-cell touch liquid crystal display device and the method for manufacturing the same according to the example embodiment of the present invention will be described with reference to the accompanying drawings.

Figure 4:
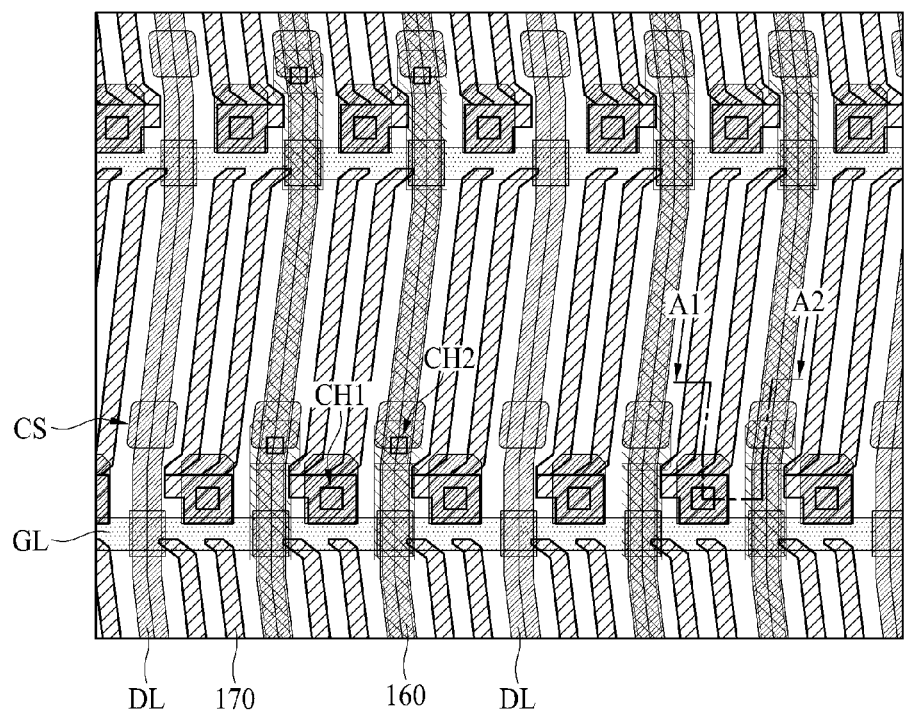
FIG. 4 illustrates an in-cell touch liquid crystal display device according to an example embodiment of the present invention, and also illustrates a plane structure of pixels arranged on a TFT array substrate.

FIG. 4 illustrates an in-cell touch liquid crystal display device according to an example embodiment of the present invention, and also illustrates a plane structure of pixels arranged on a TFT array substrate.

Referring to FIG. 4, a plurality of pixels are formed on a TFT array substrate, and each of the pixels is defined by data lines DL and gate lines GL, wherein the data lines DL cross the gate lines GL. The pixel is defined per area where the data lines DL cross the gate lines GL, and a TFT is arranged in each pixel. A storage capacitor, a pixel electrode 170 and a common electrode are arranged in each pixel. Also, conductive lines 160 are arranged to overlap some of all of the data lines DL.

Figure 5:
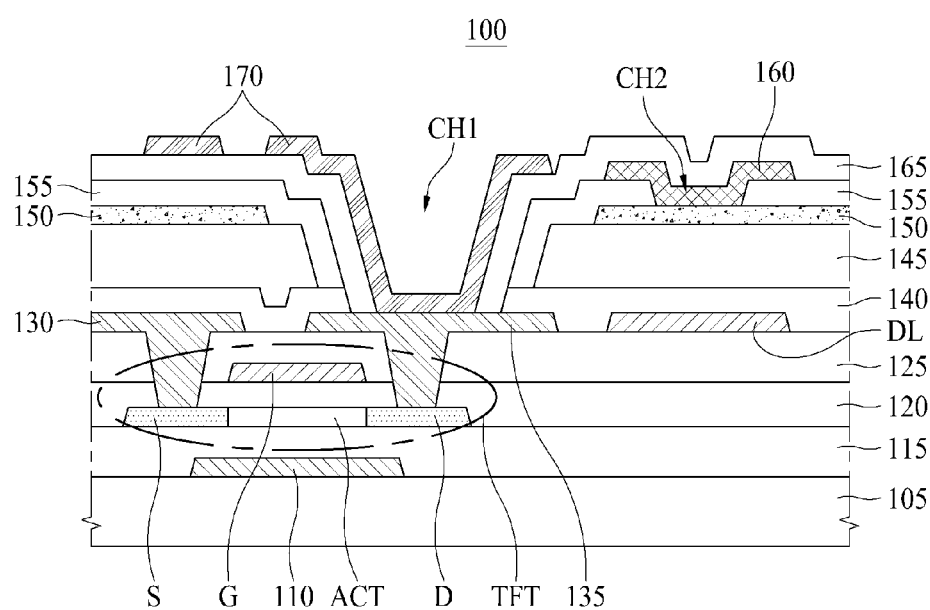
FIG. 5 illustrates an in-cell touch liquid crystal display device according to the example embodiment, and also illustrates a sectional structure of a pixel taken along line A1-A2 shown in FIG. 4.

FIG. 5 illustrates an in-cell touch liquid crystal display device according to the example embodiment, and also illustrates a sectional structure of a pixel taken along line A1-A2 shown in FIG. 4.

FIG. 5 illustrates a structure of a TFT array substrate (lower substrate) of a fringe field switch (FFS) mode, and illustrates a structure of one of a plurality of pixels. In FIG. 5, a touch sensor is built in the TFT array substrate in an in-cell touch type. Also, a pixel electrode top pixel structure is shown in FIG. 5.

In FIG. 5, a color filter array substrate (upper substrate), a liquid crystal layer, a backlight unit and a driving circuit unit are omitted. The driving circuit unit includes a timing controller T-con, a data driver D-IC, a gate driver G-IC, a sensing driver, a backlight driving unit, and a power supply supplying a driving power source to the driving circuits. In this case, all or some of the driving circuit unit may be formed on a liquid crystal panel in a COG (Chip On Glass) or COF (Chip On Flexible Printed Circuit or Chip On Film) mode.

Hereinafter, the in-cell touch liquid crystal display device according to the example embodiment of FIG. 4 will be described with reference to FIG. 5. A pixel structure of a TFT array substrate of the in-cell touch liquid crystal display device according to the example embodiment is shown in FIG. 5.

The TFT array substrate includes a glass substrate 105, a light shield layer 110, a buffer layer 115, a gate insulator 120, an inter layer dielectric (ILD) 125, a source contact layer 130, a drain contact layer 135, a first passivation layer (PAS0) 140, a second passivation layer (PAS1) 145, a common electrode 150, a third passivation layer (PAS2) 155, a conductive line 160, a fourth passivation layer (PAS3) 165, and a pixel electrode 170. Also, the TFT array substrate includes a TFT comprised of a gate electrode G, an active layer ACT, a source electrode S, and a drain electrode D.

The light shield layer 110 is arranged at a portion on the glass substrate 105, which corresponds to the active layer ACT of the TFT. The light shield layer 110 is formed of an opaque metal to prevent light from being irradiated to the active layer ACT. The light shield layer 110 is formed of Mo or Al, and may have a thickness of 500 Å to 1000 Å.

The buffer layer 115 is formed on the light shield layer 110. The buffer layer 115 is formed of a material of $SiO_2$ or SiNx, and may have a thickness of 2000 Å to 3000 Å.

The active layer ACT, the source electrode S and the drain electrode D of the TFT are arranged at an area overlapped with the light shield layer 110 on the buffer layer 115.

The gate insulator 120 is arranged to cover the active layer ACT, the source electrode S and the drain electrode D. The gate insulator 120 is formed of a material of $SiO_2$, and may have a thickness of 1000 Å to 1500 Å.

Meanwhile, the gate insulator 120 may be formed by depositing TEOS (Tetra Ethyl Ortho Silicate) or MTO (Middle Temperature Oxide) in accordance with a CVD (Chemical Vapor Deposition) process.

The gate electrode G is arranged at an area overlapped with the active layer ACT on the gate insulator 120. At this time, the gate electrode G is formed of Mo or Al, and may have a thickness of 2000 Å to 3000 Å. As described above, the TFT is comprised of the active layer ACT, the source electrode S and the drain electrode, which are arranged below the gate insulator 120, and the gate electrode G arranged on the gate insulator 120. In this case, the TFT is formed in a coplanar top gate structure.

The inter layer dielectric 125 is arranged to cover the gate insulating layer 120 and the TFT. The inter layer dielectric 125 may be formed of a material of $SiO_2$ or SiNx, and may have a thickness of 3000 Å to 6000 Å. For another example, the inter layer dielectric 125 may be formed of a deposited structure of $SiO_2$ (3000 Å)/SiNx (3000 Å).

The source contact layer 130 connected with the source electrode S of the TFT is arranged to pass through the gate insulator 120 and the inter layer dielectric 125. The drain contact layer 135 connected with the drain electrode D of the TFT is arranged to pass through the gate insulator 120 and the inter layer dielectric 125.

The source contact layer 130 and the drain contact layer 135 may be formed in a multi-layer structure deposited with Mo/Al/Mo. The source contact layer 130 is connected to the data line, and the drain contact layer 135 is connected to the pixel electrode 170.

The first passivation layer (PAS0) 140 is arranged to cover the inter layer dielectric 125, the source contact layer 130 and the drain contact layer 135. The first passivation layer (PAS0) 140 is formed of a material of $SiO_2$ or SiNx, and has a thickness of 1000 Å to 2000 Å.

The second passivation layer (PAS1) 145 is arranged to cover the first passivation layer (PAS0) 140. The second passivation layer (PAS1) 145 is formed of photo acryl, and has a thickness of 2.0 μm to 3.0 μm.

The common electrode 150 is arranged on the second passivation layer (PAS1) 145. The common electrode 150 is formed of a transparent conductive material such as ITO (indium tin oxide), IZO (indium zinc oxide) or ITZO (indium tin zinc oxide), and has a thickness of 500 Å to 1500 Å.

The third passivation layer (PAS2) 155 is arranged to cover the common electrode 150. The third passivation layer (PAS2) 155 is formed of $SiO_2$ or SiNx, and may have a thickness of 2000 Å to 3000 Å.

In this case, a second contact hole CH2 is formed at a portion of the third passivation layer (PAS2) 155, which is overlapped with the data line DL and the common electrode 150, and the conductive line 160 is arranged in the second contact hole CH2 and on the third passivation layer (PAS2) 155. As described above, the common electrode 150 and the conductive line 160 are directly in contact with each other in the second contact hole CH2.

The conductive line 160 may be formed of Mo or Al, and may have a thickness of 1500 Å to 2000 Å. Meanwhile, the conductive line 160 may be formed in a multi-layer structure deposited with Mo/Al/Mo.

In this case, the conductive line 160 is arranged to overlap the data lines DL, but is not overlapped with all the data lines of red, green and blue pixels. If a column spacer CS is arranged on the data line of the red pixel, the conductive line 160 may be arranged to overlap the data line of the green pixel and the data line of the blue pixel. However, the conductive line 160 may be arranged to overlap any one of the data lines of red, green and blue pixels without limitation to the above example.

The conductive line 160 is electrically connected to the common electrode 150 arranged in a plurality of pixels, and is arranged above the data line within the liquid crystal panel. The conductive line 160 is arranged in a shape of bar from an upper portion of the liquid crystal panel to a lower portion thereof. Since a fourth passivation layer (PAS3) 165 is arranged between the conductive line 160 and the pixel electrode 170, the conductive line 160 and the pixel electrode 170 are not in contact with each other.

Figure 16:
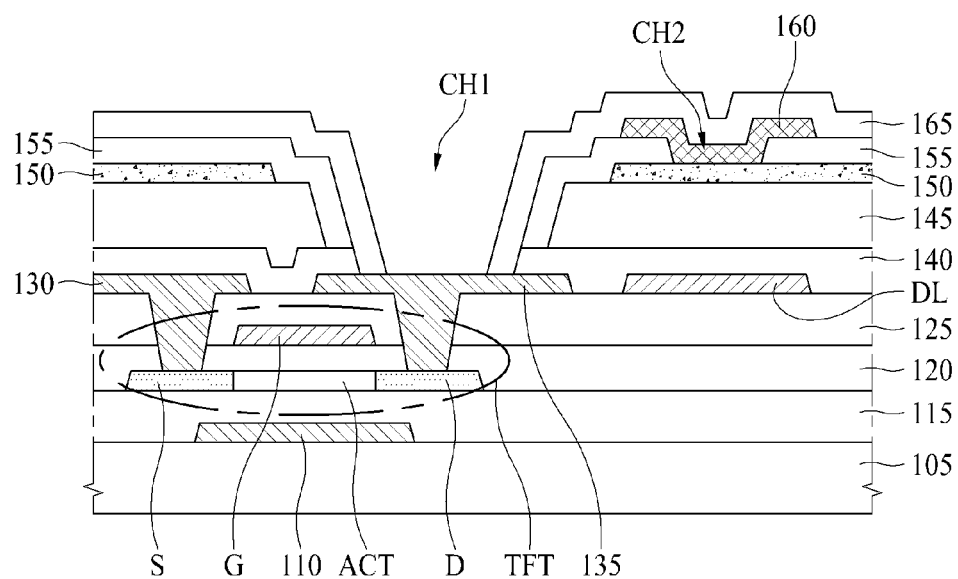
Figure 17:
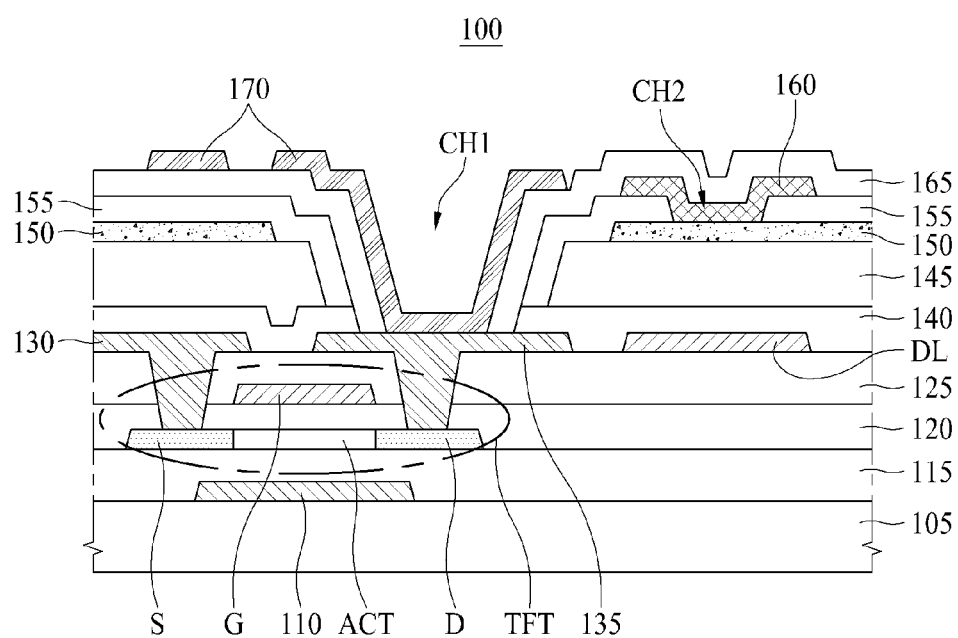

Referring to FIGS. 16 and 17, each of the conductive lines 160 connected to the common electrode 150 is connected to a channel of a drive IC 190 through a link line.

The common electrode 150 serves as a touch electrode for a touch period (non-display period) by the conductive line 160. A common voltage is supplied to the conductive line 160 for a display period. For the touch period (non-display period), a touch driving signal is supplied to the common electrode through the conductive line 160, and then capacitance formed at the common electrode through the conductive line 160 is sensed to detect whether there is a touch and a position of the touch.

The fourth passivation layer (PAS3) 165 is arranged to cover the third passivation layer (PAS2) 155 and the conductive line 160. The fourth passivation layer (PAS3) 165 is formed of $SiO_2$ or SiNx, and may have a thickness of 2000 Å to 3000 Å.

The first passivation layer (PAS0) 140, the second passivation layer (PAS1) 145, the third passivation layer (PAS2) 155, and the fourth passivation layer (PAS3) 165, which correspond to the portion overlapped with the drain contact layer 135, are removed, whereby a first contact hole CH1 is formed.

The pixel electrode 170 is arranged on the fourth passivation layer (PAS3) 165 and in the first contact hole CH1. The pixel electrode 170 is formed of a transparent conductive material such as ITO (indium tin oxide), IZO (indium zinc oxide) or ITZO (indium tin zinc oxide), and has a thickness of 500 Å to 1500 Å. The pixel electrode 170 is formed in a shape of finger, whereby a fringe field is formed between the common electrode 150 and the pixel electrode 170.

Although the pixel is formed in a common electrode Vcom top structure in the related art, the pixel is formed in a pixel electrode top structure in the in-cell touch liquid crystal display device according to the example embodiment. Therefore, the present invention can provide the in-cell touch liquid crystal display device in which a pixel is comprised in a pixel electrode top structure.

In the pixel electrode top structure, light transmittance is high at a center portion of a pixel area, and is low in the periphery of the data lines. Therefore, the in-cell touch liquid crystal display device can prevent mixed colors from being generated among the pixels as light transmittance is low in the periphery of the data lines.

Also, in the in-cell touch liquid crystal display device according to the example embodiment, the common electrode and the conductive line are directly in contact with each other, whereby loss in an aperture ratio of the pixel, which is caused by the contact structure between the common electrode and the conductive line, can be reduced.

Also, the conductive line 160 and the pixel electrode 170 are spaced from each other by interposing the fourth passivation layer (PAS3) 165 therebetween, whereby signal interference between the conductive line 160 and the pixel electrode 170 can be prevented from being generated.

FIG. 6 illustrates a method for manufacturing an in-cell touch liquid crystal display device according to the example embodiment, and also illustrates the number of masks required for the manufacturing process.

As shown in FIG. 6, the in-cell touch liquid crystal display device according to the example embodiment can be manufactured through a manufacturing process using 11 masks. Hereinafter, the method for manufacturing an in-cell touch liquid crystal display device according to the example embodiment will be described with reference to FIGS. 7 to 17 together with FIG. 6.

FIGS. 7 to 17 illustrate methods for manufacturing an in-cell touch liquid crystal display device according to the example embodiment.

Figure 7:
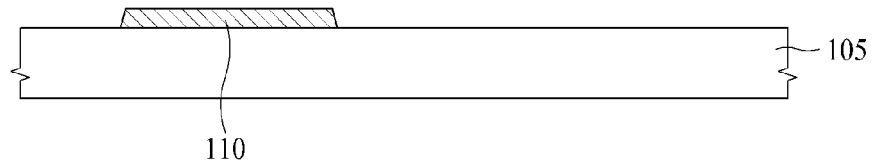
FIGS. 7 to 17 illustrate methods for manufacturing an in-cell touch liquid crystal display device according to the example embodiment.

Referring to FIG. 7, a metal material, such as Molybdenum Mo, shielding light is deposited on the glass substrate 105 to form a metal layer.

Afterwards, the metal layer is patterned through photolithography and etching processes using a first mask to form the light shield layer 110 in a TFT area. At this time, the light shield layer 110 is formed at a thickness of 500 Å to 1500 Å, and is aligned with the active layer ACT of the TFT, which is formed by a later process.

Although FIG. 7 illustrates an example that the glass substrate 105 is used as a base of the TFT array substrate, a plastic substrate may be used to substitute for the glass substrate 105.

Figure 8:
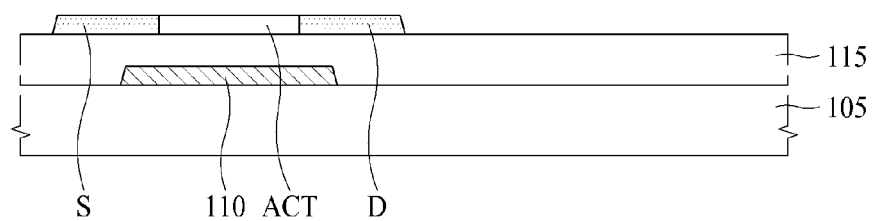

Subsequently, referring to FIG. 8, the buffer layer 115 is formed of an inorganic material, for example, $SiO_2$ or SiNx, on the glass substrate 105 to cover the light shield layer 110. At this time, the buffer layer 115 may have a thickness of 2000 Å to 3000 Å.

Afterwards, a low temperature poly silicon (LTPS) is deposited on the buffer layer 115 to form a semiconductor layer.

Then, the semiconductor layer is patterned by photolithography and dry etching processes using a second mask to form the active layer ACT of the TFT on an area overlapped with the light shield layer 110. At this time, the active layer ACT is formed at a thickness of 500 Å to 1500 Å.

Figure 9:
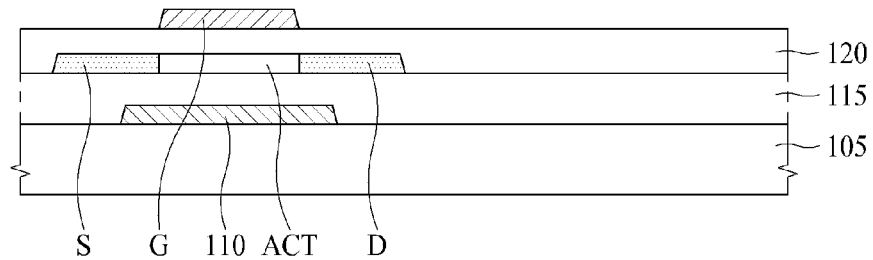

Subsequently, referring to FIG. 9, the gate insulator 120 is formed on the buffer layer 115 to cover the active layer ACT. The gate insulator 120 is formed of a $SiO_2$, and may have a thickness of 1000 Å to 1500 Å.

Meanwhile, the gate insulator 120 may be formed by depositing TEOS (Tetra Ethyl Ortho Silicate) or MTO (Middle Temperature Oxide) in accordance with a CVD (Chemical Vapor Deposition) process.

Afterwards, a metal material is deposited on the gate insulator 120, and then is patterned through photolithography and etching processes using a third mask to form the gate electrode G of the TFT.

At this time, the gate electrode G may be formed of Molybdenum Mo or Aluminum Al to have a thickness of 2000 Å to 3000 Å, and is formed at an area overlapped with the active layer ACT on the gate insulator 120. The gate electrode G is formed together with the gate line. At this time, the gate line may be arranged on the liquid crystal panel in a first direction (for example, horizontal direction).

P type or N type high impurities are doped on the outside of the active layer ACT using the gate electrode G as a mask to form the source electrode S and the drain electrode D.

In this case, a wet etching process and a dry etching process are performed when the gate electrode G is formed. P type or N type impurities may be doped on the active layer ACT between the wet etching process and the dry etching process.

As described above, the TFT is comprised of the active layer ACT, the source electrode S and the drain electrode, which are arranged below the gate insulator 120, and the gate electrode G arranged on the gate insulator 120. In this case, the TFT is formed in a coplanar top gate structure.

Figure 10:
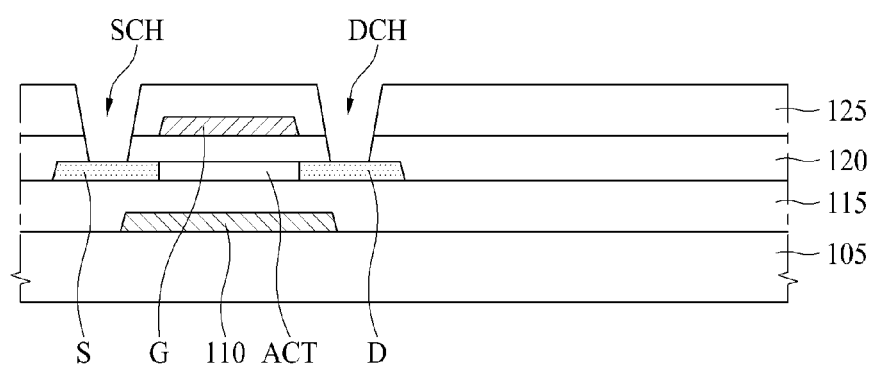

Subsequently, referring to FIG. 10, an insulating material is deposited to cover the TFT and the gate insulator 120, whereby an inter layer dielectric (ILD) 125 is formed. At this time, the inter layer dielectric 125 is formed of a material of $SiO_2$ or SiNx, and may have a thickness of 3000 Å to 6000 Å. For another example, the inter layer dielectric 125 may be formed of a deposited structure of $SiO_2$ (3000 Å)/SiNx (3000 Å).

Afterwards, the gate insulator 120 and the inter layer dielectric 125, which are overlapped with the source electrode S of the TFT, are removed by an etching process using a fourth mask. As a result, a source contact hole SCH exposing the source electrode S of the TFT is formed. At this time, the gate insulator 120 and the inter layer dielectric 125, which correspond to the portion overlapped with the drain electrode D of the TFT, are removed. As a result, a drain contact hole DCH exposing the drain electrode D of the TFT is formed.

Figure 11:
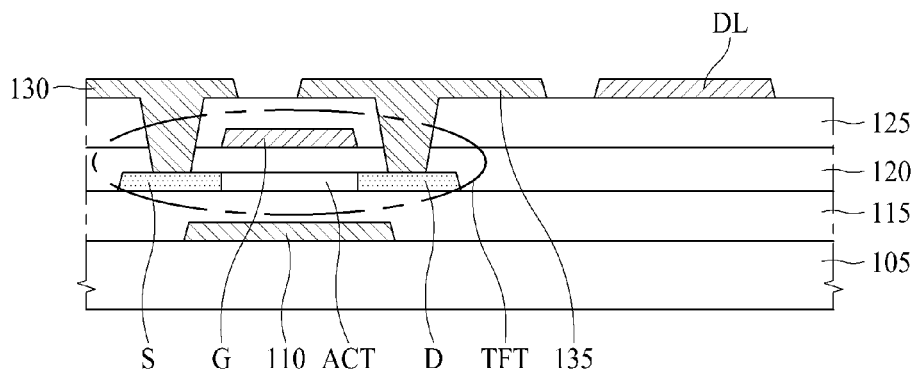

Subsequently, referring to FIG. 11, a metal material is deposited on the inter layer dielectric 125 to form a metal layer.

Afterwards, the metal layer is patterned through photolithography and etching processes using a fifth mask to form a plurality of data lines DL supplying a data voltage to a plurality of pixels. Also, the metal material is buried in the source contact hole SCH and the drain contact hole DCH to form a source contact layer 130 and a drain contact layer 135. That is, the data lines, the source contact layer 130 and the drain contact layer 135 are formed by the same mask process. At this time, the data lines DL may be arranged on the liquid crystal panel in a second direction (for example, vertical direction).

The data lines DL, the source contact layer 130 and the drain contact layer 135 are formed of Molybdenum Mo or Aluminum Al, and have a thickness of 2000 Å to 3000 Å.

Figure 12:
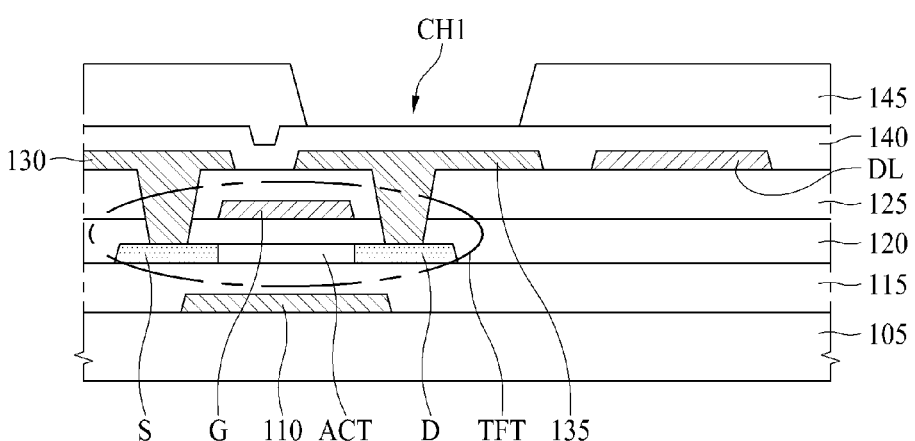

Subsequently, referring to FIG. 12, a first passivation layer (PAS0) 140 is formed on the inter layer dielectric 125. The first passivation layer (PAS0) 140 is arranged to cover the inter layer dielectric 125, the source contact layer 130 and the drain contact layer 135. The first passivation layer (PAS0) 140 is formed of a material of $SiO_2$ or SiNx, and has a thickness of 1000 Å to 2000 Å.

Afterwards, the second passivation layer (PAS1) 145 is formed by a process using a sixth mask to cover the first passivation layer (PAS0) 140. The second passivation layer (PAS1) 145 is formed of photo acryl, and has a thickness of 2.0 μm to 3.0 μm.

The second passivation layer (PAS1) 145 is not formed at a portion overlapped with the drain contact layer 135. A first contact hole CH1 through which the drain contact layer 135 is in contact with the pixel electrode is formed, by a later process, at the portion where the second passivation layer (PAS1) 145 is not formed. At this time, the first passivation layer (PAS0) 140 remains without being removed.

Figure 13:
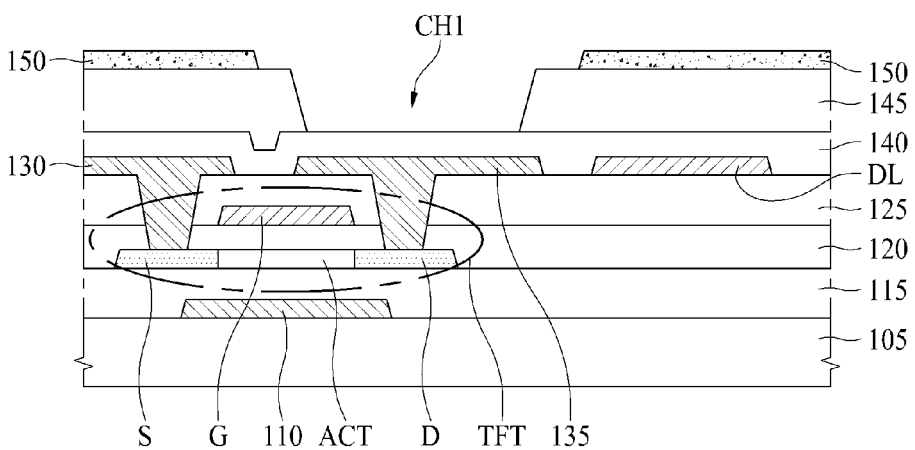

Subsequently, referring to FIG. 13, a transparent conductive material is deposited on the second passivation layer (PAS1) 145. Afterwards, a common electrode 150 is formed on the second passivation layer (PAS1) 145 by photolithography and etching processes using a seventh mask.

In this case, the common electrode 150 is formed of a transparent conductive material such as ITO (indium tin oxide), IZO (indium zinc oxide) or ITZO (indium tin zinc oxide), and has a thickness of 500 Å to 1500 Å.

Figure 14:
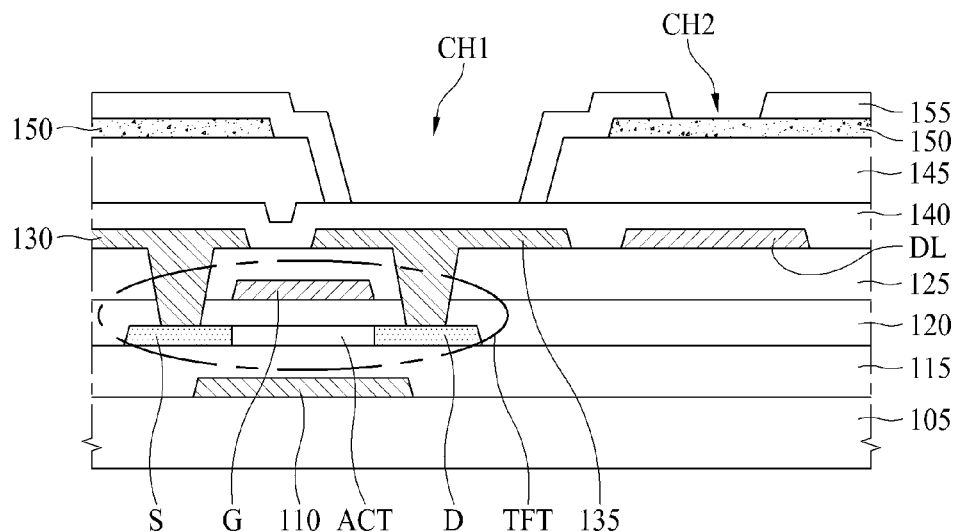

Subsequently, referring to FIG. 14, a third passivation layer (PAS2) 155 is formed to cover the common electrode 150. The third passivation layer (PAS2) 155 is formed of $SiO_2$ or SiNx, and may have a thickness of 2000 Å to 3000 Å.

Afterwards, the third passivation layer (PAS2) 155 overlapped with the common electrode 150 is removed by photolithography and etching processes using an eighth mask. As a result, a second contact hole CH2 partially exposing the common electrode 150 is formed. The second contact hole CH2 is formed in an area overlapped with the data line DL and the common electrode 150.

In this case, the second contact hole CH2 is intended to electrically connect the common electrode 150 with the conductive line 160.

Figure 15:
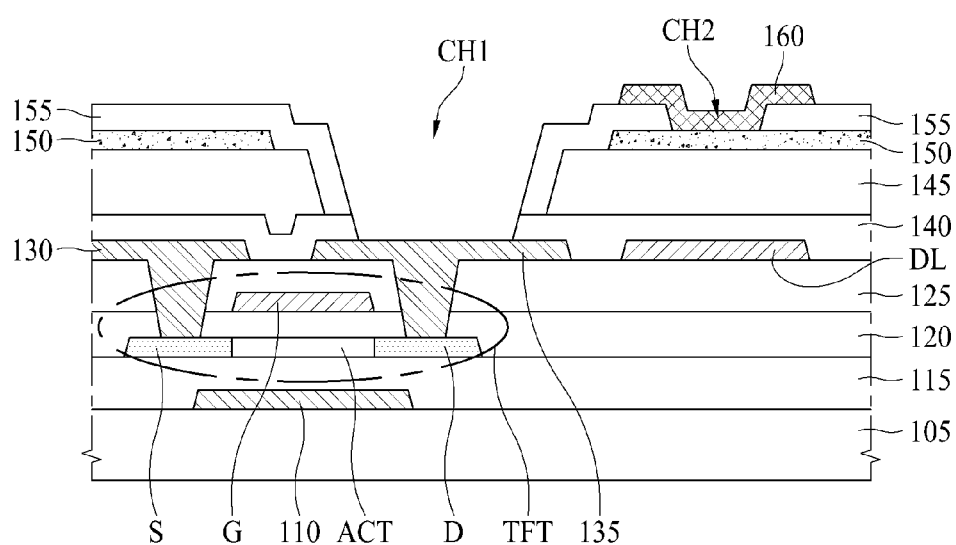

Subsequently, referring to FIG. 15, a metal material is deposited on the third passivation layer 155. Afterwards, the metal layer is patterned through photolithography and etching processes using a ninth mask. As a result, a conductive line 160 is formed to be in contact with the common electrode 150.

The conductive line 160 is arranged in the second contact hole CH2 and on the third passivation layer (PAS2) 155, and the common electrode 150 and the conductive line 160 are directly in contact with each other in the second contact hole CH2.

The conductive line 160 may be formed of Molybdenum Mo or Aluminum Al, and may have a thickness of 1500 Å to 2000 Å. Meanwhile, the conductive line 160 may be formed in a multi-layer structure deposited with Mo/Al/Mo.

In this case, the conductive line 160 is formed to overlap the data lines DL, and connects the common electrodes 150 of pixels adjacent to one another in a vertical direction within the liquid crystal panel. The conductive line 160 is not overlapped with all the data lines of red, green and blue pixels. If a column spacer is arranged on the data line of the red pixel, the conductive line 160 may be arranged to overlap the data line of the green pixel and the data line of the blue pixel. However, the conductive line 160 may be arranged to overlap any one of the data lines of red, green and blue pixels without limitation to the above example.

Subsequently, referring to FIG. 16, a fourth passivation layer (PAS3) 165 is formed to cover the third passivation layer (PAS2) 155 and the conductive line 160.

Afterwards, the first passivation layer (PAS0) 140, the third passivation layer (PAS2) 155, and the fourth passivation layer (PAS3) 165, which correspond to the portion overlapped with the drain contact layer 135, are removed by photolithography and etching processes using a tenth mask. As a result, a first contact hole CH1 exposing the drain contact layer 135 is formed.

As described above, the first passivation layer (PAS0) 140, the third passivation layer (PAS2) 155, and the fourth passivation layer (PAS3) 165 are removed by photolithography and etching processes using a tenth mask at one time to form the first contact hole CH1.

In this case, the first contact hole CH1 is intended to electrically connect the drain electrode D with the pixel electrode.

Subsequently, referring to FIG. 17, a transparent conductive material is deposited on the fourth passivation layer (PAS3) 165 and in the first contact hole CH1. Afterwards, a pixel electrode 170 is formed on the fourth passivation layer (PAS3) 165 and in the first contact hole CH1 by photolithography and etching processes using an eleventh mask. The pixel electrode 170 is connected with the drain contact layer 135 in the first contact hole CH1, whereby the drain electrode D of the TFT is electrically connected with the pixel electrode 170. The conductive line 160 is not in contact with the pixel electrode 170.

In this case, the pixel electrode 170 is formed of a transparent conductive material such as ITO (indium tin oxide), IZO (indium zinc oxide) or ITZO (indium tin zinc oxide), and has a thickness of 500 Å to 1500 Å. The pixel electrode 170 is formed in a shape of finger, whereby a fringe field is formed between the common electrode 150 and the pixel electrode 170.

In the method for manufacturing an in-cell touch liquid crystal display device according to the example embodiment, the pixels may be formed in a pixel electrode top structure. In the pixel electrode top structure, light transmittance is high at a center portion of a pixel area, and is low in the periphery of the data lines. Therefore, the in-cell touch liquid crystal display device can prevent mixed colors from being generated among the pixels.

Also, in the in-cell touch liquid crystal display device according to the example embodiment, the common electrode and the conductive line are directly in contact with each other, whereby loss in an aperture ratio of the pixel, which is caused by the contact structure between the common electrode and the conductive line, can be reduced.

Figure 18:
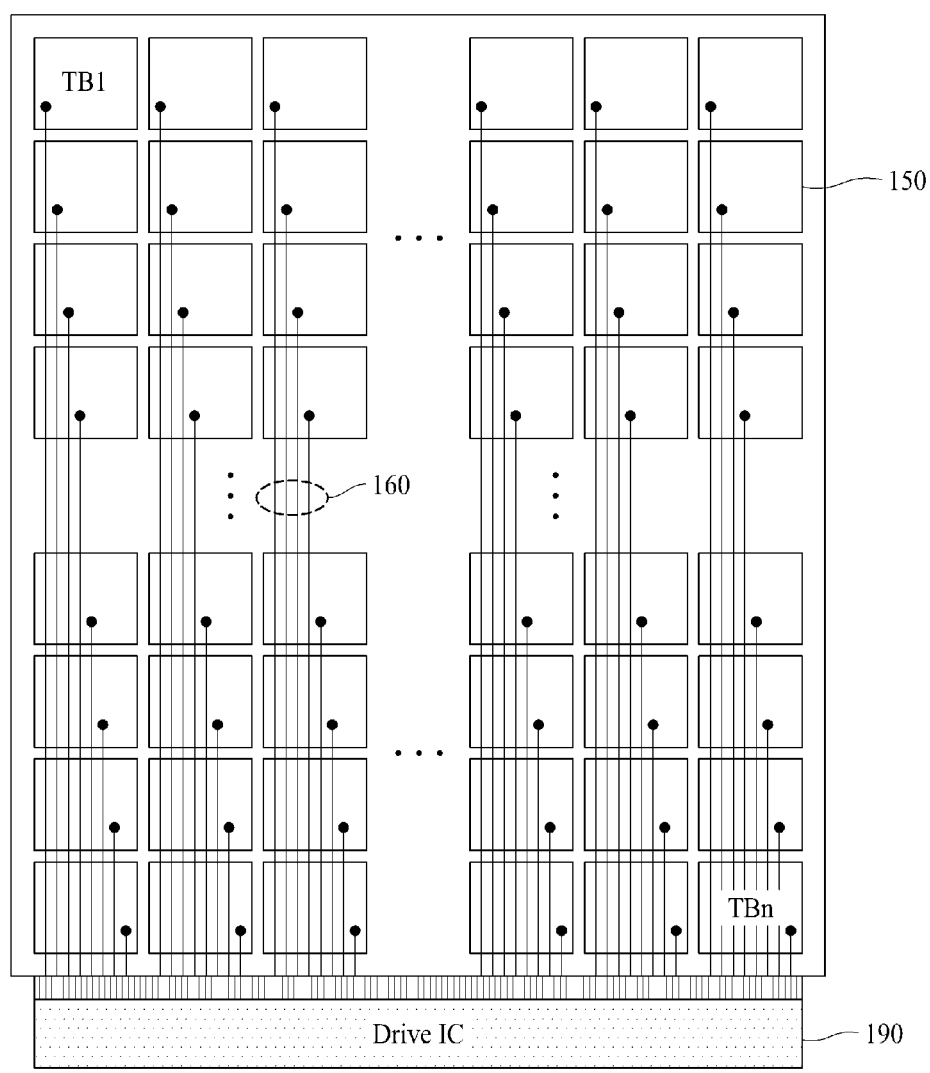
FIG. 18 illustrates an example of an arrangement structure of a conductive line connecting a touch electrode with a drive integrated circuit (IC)
Figure 19:
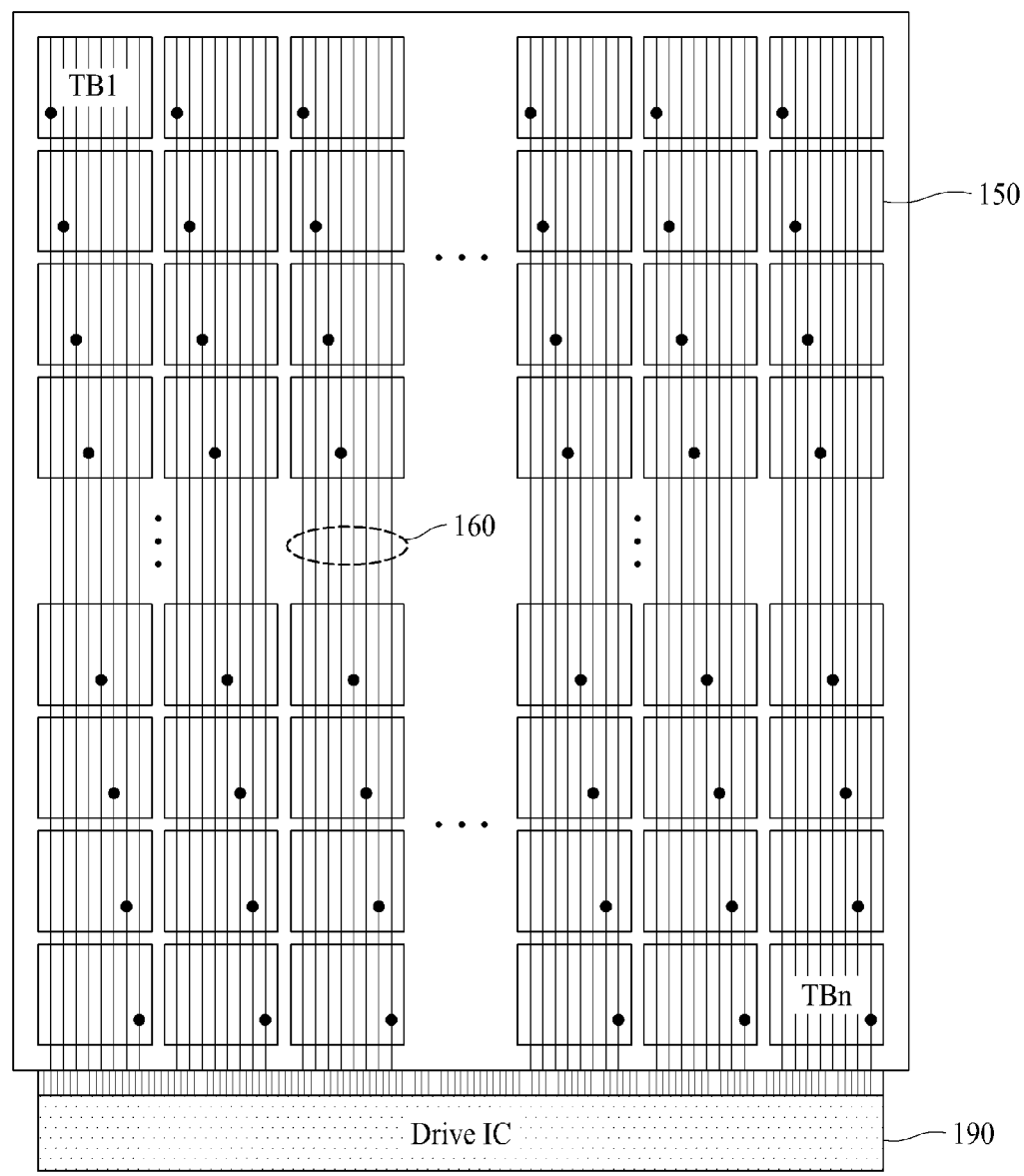
FIG. 19 illustrates another example of an arrangement structure of a conductive line connecting a touch electrode with a drive integrated circuit (IC).

FIG. 18 illustrates an example of an arrangement structure of a conductive line connecting a touch electrode with a drive integrated circuit (IC), and FIG. 19 illustrates another example of an arrangement structure of a conductive line connecting a touch electrode with a drive integrated circuit (IC).

In FIGS. 18 and 19, the touch electrode and the conductive line of the in-cell touch liquid crystal display device according to the example embodiment are arranged in a self capacitive in cell touch mode.

Referring to FIGS. 18 and 19, in the in-cell touch liquid crystal display device according to the example embodiment, a plurality of conductive lines 160 are formed in an active area of a liquid crystal panel. In this case, the conductive lines 160 are arranged vertically to overlap the data lines. Therefore, a problem that a bezel area is increased by routing of the conductive line 160 does not occur.

For example, as shown in FIG. 18, the conductive line 160 may be arranged to reach a lower end of the active area by starting with a portion connected with the common electrode 150. For another example, as shown in FIG. 19, the conductive line 160 may be arranged from an upper end of the active area to the lower end thereof. If the conductive line 160 is formed from the upper end of the active area to the lower end thereof, a capacitance value based on routing of the conductive line 160 becomes uniform, whereby accuracy of touch sensing can be enhanced.

The present invention can provide the in-cell touch liquid crystal display device of a pixel electrode top structure and the method for manufacturing the same.

The in-cell touch liquid crystal display device according to the example embodiment is formed in a pixel electrode top structure, whereby mixed colors can be prevented from being generated among the pixels.

In the in-cell touch liquid crystal display device according to the example embodiment, the common electrode and the conductive line are directly in contact with each other, whereby loss in an aperture ratio of the pixel, which is caused by the contact structure between the common electrode and the conductive line, can be reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An in-cell touch liquid crystal display device, comprising:
   a thin film transistor (TFT) arranged in a plurality of pixel areas;
   a source contact layer connected to a source electrode of the TFT and a drain contact layer connected to a drain electrode of the TFT;

a data line arranged in the same layer with the source contact layer and the drain contact layer;

first and second passivation layers arranged on the source contact layer, the drain contact layer, and the data line;

a common electrode arranged on the second passivation layer;

a third passivation layer arranged on the common electrode;

a conductive line arranged to overlap the common electrode and directly contacted to the common electrode by passing through the third passivation layer;

a fourth passivation layer arranged on the third passivation layer and the conductive line; and a pixel electrode connected to the drain contact layer in a first contact hole and arranged on the fourth passivation layer.

2. The in-cell touch liquid crystal display device of claim 1, wherein the conductive line is arranged in a second contact hole exposing the common electrode by penetrating the third passivation layer.

3. The in-cell touch liquid crystal display device of claim 2, wherein the second contact hole and the conductive line are formed in an area overlapped with the data line.

4. The in-cell touch liquid crystal display device of claim 1, wherein the fourth passivation layer is arranged between the conductive line and the pixel electrode, and the conductive line and the pixel electrode are spaced apart from each other.

5. The in-cell touch liquid crystal display device of claim 1, wherein the first contact hole exposes the drain contact layer by penetrating the first to fourth passivation layer.

6. The in-cell touch liquid crystal display device of claim 1, wherein the common electrode is in a shape of a plate and the pixel electrode is in a shape of fingers.

7. The in-cell touch liquid crystal display device of claim 1, further comprising a plurality of data lines, each data line corresponding to pixel areas of respective emission color, wherein the conductive line overlaps at least one of the data lines connected to pixel areas that emit different light respectively of at least two different emission colors.

8. The in-cell touch liquid crystal display device of claim 7, further comprising a column spacer that overlaps the data line that does not overlap the conductive line.

9. The in-cell touch liquid crystal display device of claim 1, wherein the conductive line is one of a plurality of conductive lines, wherein the common electrode is one of a plurality of common electrodes such that each conductive line is connected to a respective one of the common electrode electrodes, and wherein adjacent ones of the conductive lines are not connected to each other.

10. The in-cell touch liquid crystal display device of claim 1, wherein a width of the conductive line is substantially the same as a width of the data line.

11. A method for manufacturing an in-cell touch liquid crystal display device, the method comprising:

forming a thin film transistor (TFT) in a plurality of pixel areas;

forming a source contact layer connected to a source electrode of the TFT, a drain contact layer connected to a drain electrode of the TFT, and a data line in the same layer with the source contact layer and the drain contact layer;

forming first and second passivation layers on the source contact layer, the drain contact layer, and the data line;

forming a common electrode on the second passivation layer;

forming a third passivation layer on the common electrode;

forming a second contact hole partially exposing the common electrode by penetrating the third passivation layer;

forming a conductive line in the second contact hole to be directly connected with the common electrode;

forming a fourth passivation layer on the third passivation layer and the conductive line;

forming a first contact hole exposing the drain contact layer; and forming a pixel electrode in the first contact hole and on the fourth passivation layer.

12. The method of claim 11, wherein the first to fourth passivation layers corresponding to an area overlapped with the drain contact layer are removed to form the first contact hole, and the third passivation layer corresponding to an area overlapped with the common electrode is removed to form the second contact hole.

13. The method of claim 12, wherein forming the conductive line includes arranging the conductive line in the second contact hole to connect with the common electrode.

14. The method of claim 12, wherein forming the second contact hole includes forming the second contact hole to overlap with the data line.

15. The method of claim 14, wherein forming the conductive line includes forming the conductive line to overlap with the data line.

16. The method of claim 11, wherein forming a first contact hole exposing the drain contact layer includes forming the first contact hole by penetrating the first to fourth passivation layer.

* * * * *